(12) United States Patent
Zhu et al.

(10) Patent No.: US 9,059,516 B2
(45) Date of Patent: Jun. 16, 2015

(54) 3D PACKAGE DEVICE OF PHOTONIC INTEGRATED CHIP MATCHING CIRCUIT

(71) Applicant: INSTITUTE OF SEMICONDUCTORS, CHINESE ACADEMY OF SCIENCES, Beijing (CN)

(72) Inventors: Ninghua Zhu, Beijing (CN); Jiasheng Wang, Beijing (CN); Jianguo Liu, Beijing (CN); Yu Liu, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 293 days.

(21) Appl. No.: 13/713,461

(22) Filed: Dec. 13, 2012

(65) Prior Publication Data

US 2014/0078011 A1   Mar. 20, 2014

(30) Foreign Application Priority Data

Sep. 14, 2012 (CN) .......................... 2012 1 0342284

(51) Int. Cl.
| | |
|---|---|
| *H01Q 11/02* | (2006.01) |
| *H01Q 13/20* | (2006.01) |
| *G02F 1/01* | (2006.01) |
| *H01L 23/66* | (2006.01) |
| *H01P 11/00* | (2006.01) |

(52) U.S. Cl.
CPC .............. *H01Q 13/206* (2013.01); *H01L 23/66* (2013.01); *H01P 11/003* (2013.01); *H01L 2224/48091* (2013.01); *H01L 2224/45144* (2013.01); *G02F 1/0121* (2013.01)

(58) Field of Classification Search
CPC .................................. H01Q 11/02; H01Q 1/38
USPC .................. 343/731, 700 MS, 702; 257/664; 333/247
See application file for complete search history.

(56) References Cited

U.S. PATENT DOCUMENTS

| | | | | |
|---|---|---|---|---|
| 3,786,375 | A * | 1/1974 | Sato et al. ...................... | 333/247 |
| 5,006,858 | A * | 4/1991 | Shirosaka .............. | 343/700 MS |
| 5,936,492 | A * | 8/1999 | Shingyoji et al. ............. | 333/246 |
| 6,285,269 | B1 * | 9/2001 | Ishikawa et al. ............... | 333/247 |
| 6,365,961 | B1 * | 4/2002 | Tomie ........................... | 257/664 |
| 7,388,451 | B2 * | 6/2008 | Brunone et al. ................ | 333/34 |

* cited by examiner

*Primary Examiner* — Huedung Mancuso
(74) *Attorney, Agent, or Firm* — Westman, Champlin & Koehler, P.A.

(57) ABSTRACT

A 3D package device of a photonic integrated chip matching circuit, comprising: a first carrier substrate; a first microwave transmission line array formed by evaporation on the top surface of the first carrier substrate to provide bias voltages and high-frequency modulation signals to the photonic integrated chip; a second carrier substrate formed perpendicularly to the first carrier substrate or to have a certain angle with respect to the first carrier substrate, so as to constitute a 3D structure; a second microwave transmission line array formed by evaporation on the bottom surface of the second carrier substrate to match electrodes of the first microwave transmission line array, the second microwave transmission line array being soldered or sintered with the electrodes of the first microwave transmission line array; an electrode array formed by evaporation on a side surface or two opposite side surfaces of the second carrier substrate; and a microwave circuit.

5 Claims, 7 Drawing Sheets

3D PACKAGE DEVICE OF PHOTONIC INTEGRATED CHIP MATCHING CIRCUIT

CROSS-REFERENCE TO RELATED APPLICATION

The present application claims priority of Chinese patent application Serial No. 201210342284.3, filed Sep. 14, 2012, the content of which is hereby incorporated by reference in its entirety.

TECHNICAL FIELD

The present disclosure relates to the technical field of optoelectronics device. In particular, the present disclosure relates to a 3D package device of a photonic integrated chip matching circuit.

BACKGROUND

Currently, it has become more and more difficult for an optical network device constituted by separated optoelectronics devices to satisfy the requirement of an optical fiber communication network, which is undergoing rapid development. Photonic integrated chip (PIC) technology is a key technology for implementing an optical network with large capacity and low power consumption. In order to load external microwave signals on the photonic integrated chip effectively, an impedance matching microwave circuit with high efficiency, low reflection, and low loss is necessary for a transition heat sink.

Differently from the separated devices, an integrated device may have a dimension scaled down to micro-nano order due to its ultra-high integration, which puts forward stricter requirement on development and package of the device. A circuit design utilizing microwave waveguide generally employed in current separated device package is not suitable for array package. In cases where co-plane waveguide transmission line or micro-strip transmission line circuit typically used for single-way package is employed, a matching resistor is connected in parallel at the end of the transmission line. The matching resistor is difficult to manufacture due to dimension limitation of multi-way integrated device. If electrodes are elicited via gold wires, significant inductive effect may occur due to the dimension limitation of the device because the length of the gold wire may be too long or the diameter of the gold wire may be too small. As a result, there may introduce large number of parasite parameters and thus high-frequency performance of the whole array will be affected.

Moreover, the present disclosure may also address heat dissipation problem of the die array caused by the ultra-high integration.

SUMMARY

Therefore, the present disclosure provides, among other things, a 3D package device of a photonic integrated chip matching circuit. According to the present disclosure, dimension limitation of the matching circuit caused by limited space between chips in a photonic integrated chip array that occurs in formation of the photonic integrated chip array package can be avoided. As a result, design of the microwave circuit is no longer restrained in a 2D plane. More dimensions are available for the circuit design, which provides more space for the microwave circuit.

According to the present disclosure, there is provided a 3D package device of a photonic integrated chip matching circuit, comprising:
a first carrier substrate 1;
a first microwave transmission line array 2 formed by evaporation on the top surface of the first carrier substrate 1 to provide bias voltages and high-frequency modulation signals to the photonic integrated chip;
a second carrier substrate 3 formed to be perpendicular to the first carrier substrate 1 or to have a certain angle with respect to the first carrier substrate 1, so as to constitute a 3D structure;
a second microwave transmission line array 4 formed by evaporation on the bottom surface of the second carrier substrate 3 to match electrodes of the first microwave transmission line array 2, the second microwave transmission line array 4 being soldered or sintered with the first microwave transmission line array 2;
an electrode array 5 formed by evaporation on a side surface or two opposite side surfaces of the second carrier substrate 3; and
a microwave circuit 6.

In the above solution, the first carrier substrate 1 and the second carrier substrate 3 may be made of any one of aluminium nitride, beryllium nitride, aluminium oxide, diamond, beryllium oxide, and silicon carbide.

In the above solution, transmission line units in the first microwave transmission line array 2 and the second microwave transmission line array 4 may be co-plane waveguides or micro-strip transmission lines.

In the above solution, the electrode array 5 is connected with a signal electrode array of the second microwave transmission line array 4, and a border of the electrode array 5 has a dimension that matches that of a border of the signal electrode array of the second microwave transmission line array 4.

In the above solution, the microwave circuit 6 is any one of an impedance matching circuit, a DC bias circuit, or any other microwave package circuit.

The present disclosure may provide the following advantages:

1. According to the 3D package device of the photonic integrated chip matching circuit provided by the present disclosure, dimension limitation of the matching circuit caused by limited space between chips in a photonic integrated chip array that occurs in formation of the photonic integrated chip array package can be avoided. As a result, design of the microwave circuit is no longer restrained in a 2D plane. More dimensions circuit designs can be achieved, which provides more space for the microwave circuit.

2. According to the 3D package device of the photonic integrated chip matching circuit provided by the present disclosure, reflection of the device modules and the number and length of the gold wires can be reduced. Modulation efficiency of the microwave signal can be improved and impedance matching of the photonic integrated chip can be achieved. Certain embodiments according to the present disclosure are suitable for package of various device integration structures comprising multi-way parallel lasers or electric absorption, modulators.

3. According to the 3D package device of the photonic integrated chip matching circuit provided by the present disclosure, heat dissipation area of transition heat sink of the photonic integrated array chip is increased, thereby increasing heat dissipation capability.

BRIEF DESCRIPTION OF THE DRAWINGS

The present disclosure will be further explained in connection with embodiments and with reference to the drawings, in which:

FIGS. 2-1, 2-2, and 2-3 schematically show an embodiment of a 3D package device of a photonic integrated chip matching circuit provided by the present disclosure, which is an impedance matching circuit of an electric absorption modulation laser array package.

FIG. 3 is a schematic view of a second carrier substrate 3 and a microwave circuit formed by evaporation on a surface of the second carrier substrate 3 for the impedance matching circuit of the electric absorption modulation laser array package.

FIGS. 5-1 and 5-2 schematically show an embodiment of a 3D package device of a photonic integrated chip matching circuit provided by the present disclosure, which comprises a bias circuit and an impedance matching circuit of a direct modulation laser array package.

DETAILED DESCRIPTION OF EMBODIMENTS

The present disclosure will be further explained in detail in connection with specific embodiments and with reference to the drawings, so that objects, technical solutions and beneficial effects thereof will become more apparent.

Figure 1:
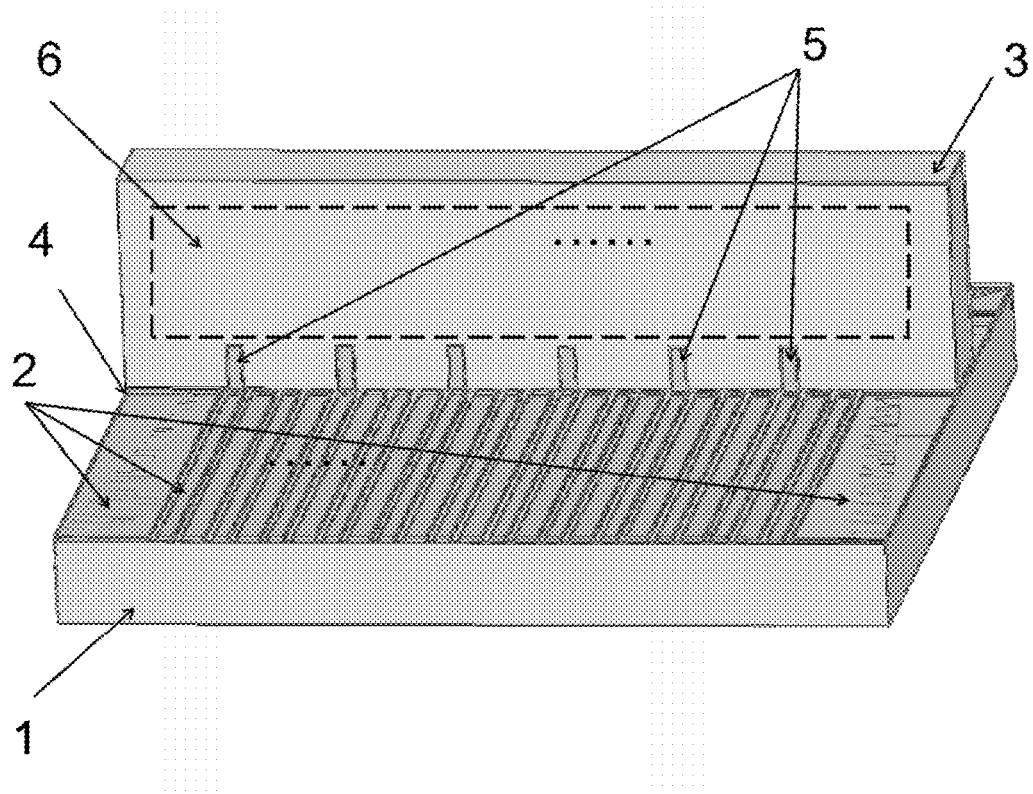
FIG. 1 is a structural schematic view of a 3D package device of a photonic integrated chip matching circuit provided by the present disclosure.

FIG. 1 is a structural schematic view of a 3D package device of a photonic integrated chip matching circuit provided by the present disclosure. The device comprises: a first carrier substrate 1; a first microwave transmission line array 2 formed by evaporation on the top surface of the first carrier substrate 1 to provide bias voltages and high-frequency modulation signals to the photonic integrated chip; a second carrier substrate 3 formed to be perpendicular to the first carrier substrate 1 or to have a certain angle with respect to the first carrier substrate 1, so as to constitute a 3D structure; a second microwave transmission line array 4 formed by evaporation on the bottom surface of the second carrier substrate 3 to match electrodes of the first microwave transmission line array 2, the second microwave transmission line array 4 being soldered or sintered with the first microwave transmission line array 2; an electrode array 5 formed by evaporation on a side surface or two opposite side surfaces of the second carrier substrate 3; and a microwave circuit 6.

The first carrier substrate 1 and the second carrier substrate 3 may be made of any one of aluminium nitride, beryllium nitride, aluminium oxide, diamond, beryllium oxide, and silicon carbide. Transmission line units in the first microwave transmission line array 2 and the second microwave transmission line array 4 may be co-plane waveguides or micro-strip transmission lines. The electrode array 5 is connected with a signal electrode array of the second microwave transmission line array 4, and a border of the electrode array 5 has a dimension that matches that of a border of the signal electrode array of the second microwave transmission line array 4. The microwave circuit 6 is any one of an impedance matching circuit, a DC bias circuit, or any other microwave package circuit.

Figures 1, 2:
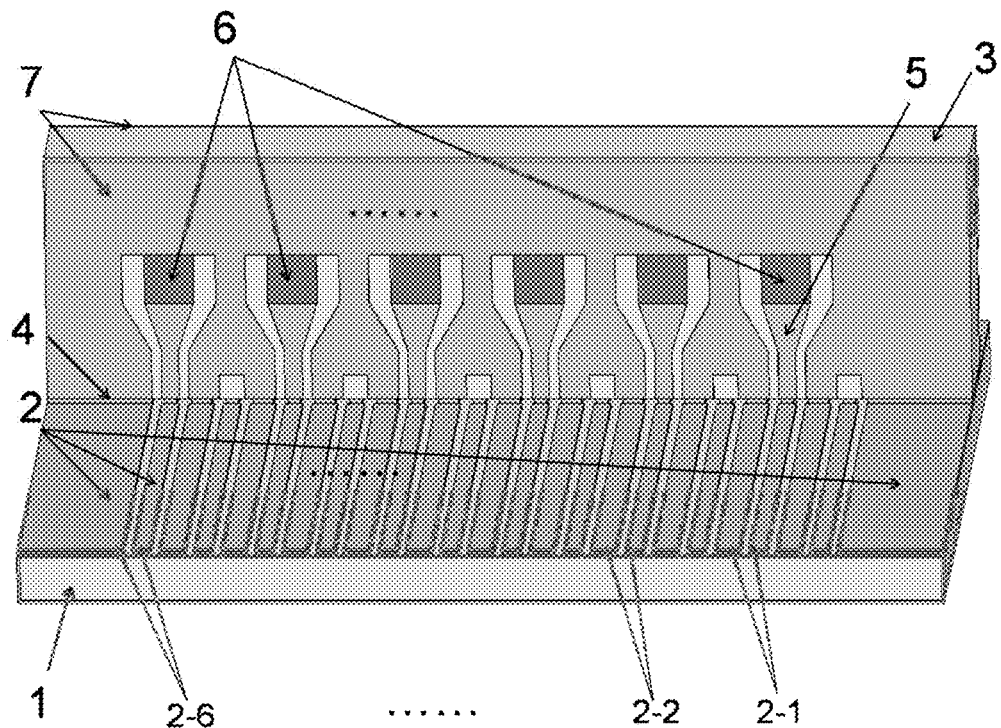
Figure 2:
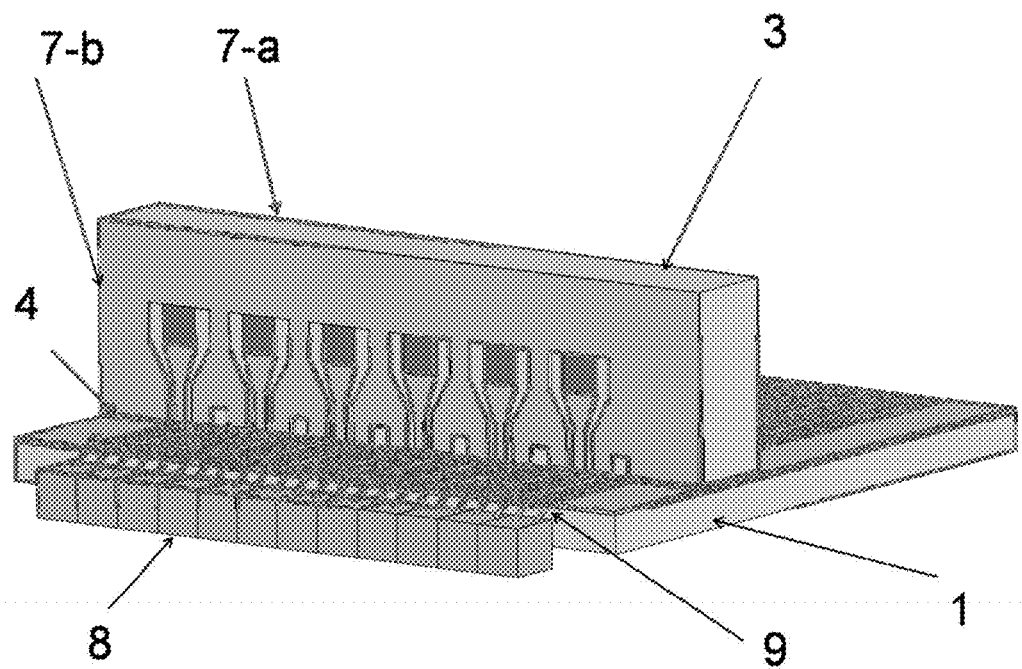
Figures 2, 3:
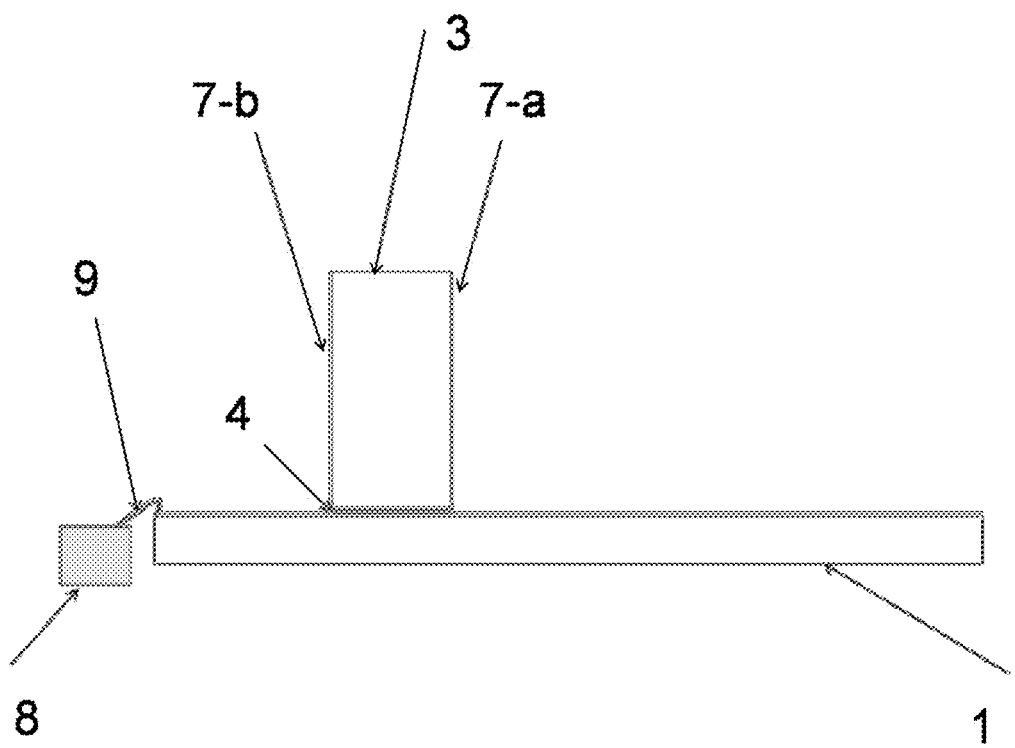
Figure 3:
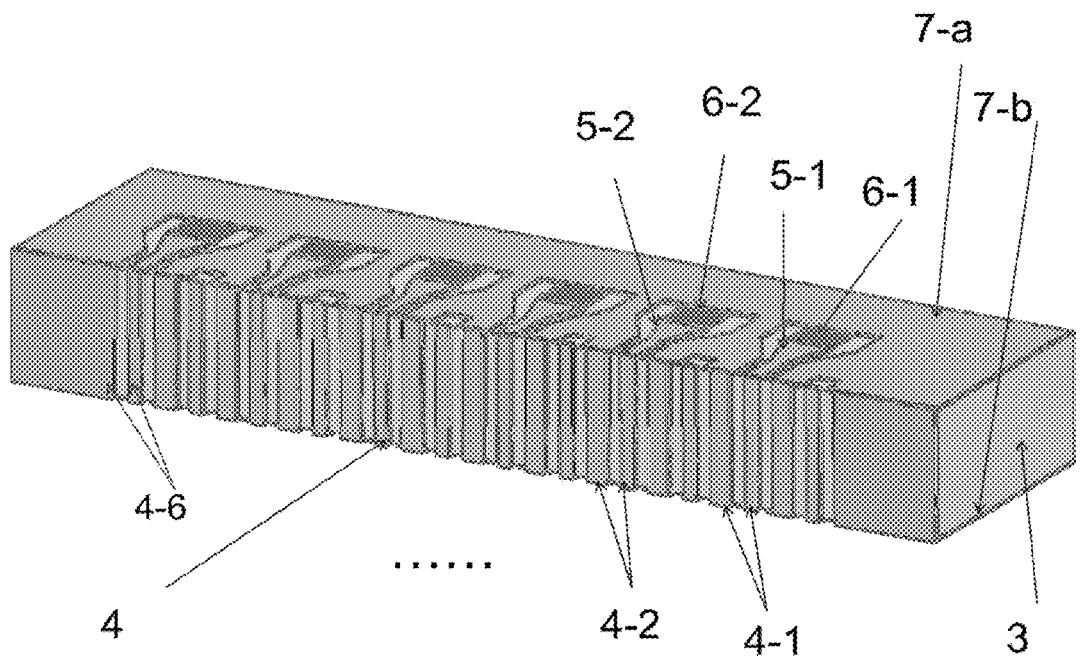
Figure 4:
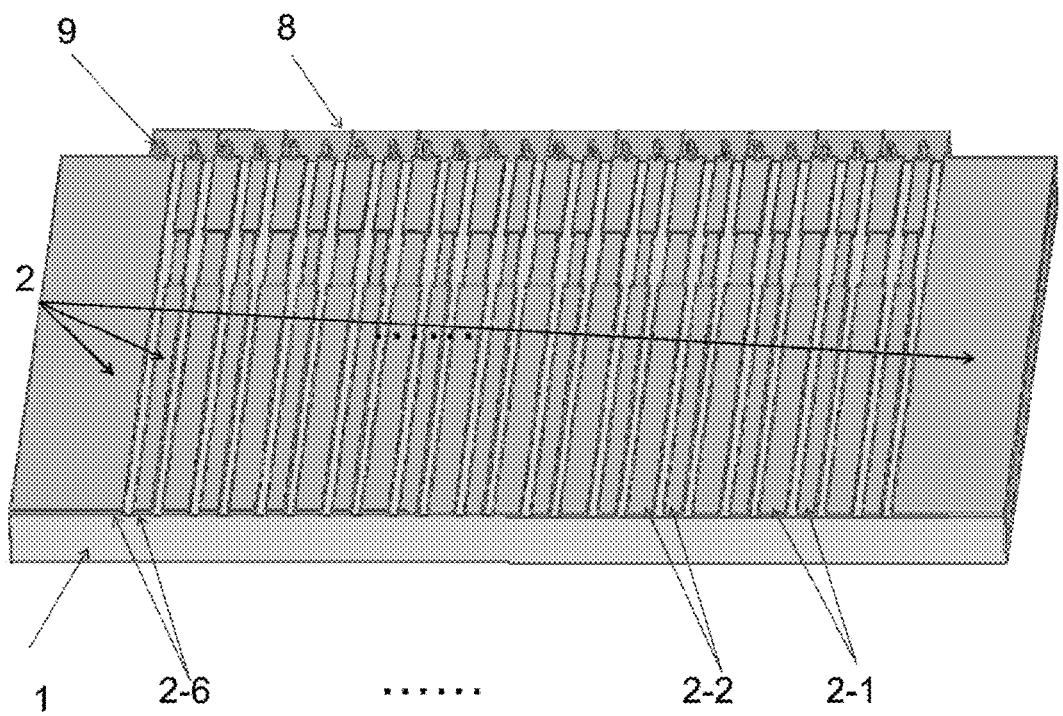
FIG. 4 is a schematic view of a first carrier substrate 1 and a microwave circuit formed by evaporation on a surface of the first carrier substrate 1 for the impedance matching circuit of the electric absorption modulation laser array package.

FIGS. 2~4 schematically show a first embodiment of a 3D package device of a photonic integrated chip matching circuit provided by the present disclosure, which is an impedance matching circuit of an electric absorption modulation laser array package.

The 3D package device comprises:

a first carrier substrate 1, which may be made of any one of aluminium nitride, beryllium nitride, aluminium oxide, diamond, beryllium oxide, and silicon carbide;

a first microwave transmission line array 2 formed by evaporation on the top surface of the first carrier substrate 1 to provide bias voltages and high-frequency modulation signals to the photonic integrated chip. Each transmission line unit in the first microwave transmission line array 2 may be a co-plane waveguide or a micro-strip transmission line. In this embodiment, the first microwave transmission line array 2 may provide backward bias voltages and high-frequency modulation signals to the electric absorption modulation array in the photonic integrated chip. As shown in FIG. 4, the first microwave transmission line array 2 may have a co-plane waveguide structure comprising 12 transition line units;

a second carrier substrate 3, which may be made of any one of aluminium nitride, beryllium nitride, aluminium oxide, diamond, beryllium oxide, and silicon carbide;

a second microwave transmission line array 4 formed by evaporation on the bottom surface of the second carrier substrate 3 to match electrodes of the first microwave transmission line array 2. Each transmission line unit in the second microwave transmission line array 4 may be a co-plane waveguide or a micro-strip transmission line. The second microwave transmission line array 4 is soldered or sintered with electrodes of the first microwave transmission line array 2, so that each signal electrode unit in the first microwave transmission line array 2 has good contact with a corresponding signal electrode unit in the second microwave transmission line array 4 and a corresponding ground electrode, as shown in FIG. 4 by 2-1, 4-1, 2-2, and 4-2;

an electrode array 5 formed by evaporation on a side surface or two opposite side surfaces of the second carrier substrate 3. The electrode array 5 is connected with a signal electrode array of the second microwave transmission line array 4, and a border of the electrode array 5 has a dimension that matches that of a border of the signal electrode array of the second microwave transmission line array 4, as shown in FIG. 3 by 5-1, 4-1, 5-2, and 4-2. In this embodiment, the electrode array 5 is formed by evaporation on two opposite side surfaces of the second carrier substrate 3 and comprises 12 signal electrode units;

a thin-film resistor array 6. The thin-film resistor array 6 is formed on the second carrier substrate 3 and comprises tantalum nitride or nichrome. The thin-film resistor array 6 is connected with the electrode array 5 and realize good contact. As shown in FIG. 3 by 6-1, 5-1, 6-2, and 5-2, each resistor unit in the thin-film resistor array 6 may have a regular shape, such as rectangular or fanshape, or can be designed according to actual requirement. The thin-film resistor is connected in parallel with the electric absorption modulator array to achieve impedance matching of the electric absorption modulator;

a ground electrode 7. The ground electrode 7 is formed by evaporation at a side surface or two opposite side surfaces of the second carrier substrate 3 to form a co-plane waveguide structure or a micro-strip structure together with the electrode array 5. The ground electrode 7 is connected with the thin-film resistor array 6 to achieve good contact. As shown in FIG. 2, the ground electrode 7 is formed by evaporation on the two opposite side surfaces of the second carrier substrate 3 to form a co-plane waveguide structure together with respective signal electrode units in the electrode array 5. The width of the space between the ground electrode 7 and each signal electrode unit in the electrode array 5 is determined by electrical characteristics of the second carrier substrate 3 and characteristic impedance value of the microwave transmission line. The resistance value of each resistor unit in the thin-film resistor array 6 is determined by the characteristic impedance value of the co-plane waveguide structure or micro-strip structure formed by the electrode array 5 and the ground electrode 7, so as to satisfy the characteristic impedance matching requirement. Electrical isolation is provided between the ground electrode 7-*a*/7-*b* and a corresponding signal electrode sequence of a respective opposing side surface. Furthermore, because the ground electrode 7 on the surface of the second carrier substrate 3 is made of metal, which is a good conductor of heat, heat dissipation area is greatly increased and heat dissipation performance is improved; and an electric absorption modulation laser chip array 8. In this embodiment, the electric absorption modulation laser chip array 8 comprises 12 lasers. Electric absorption modulator array in the electric absorption modulation laser chip array 8 is connected with respective transmission line units in the first microwave transmission line array 2 via an interconnection gold wire group 9.

Figures 1, 5:
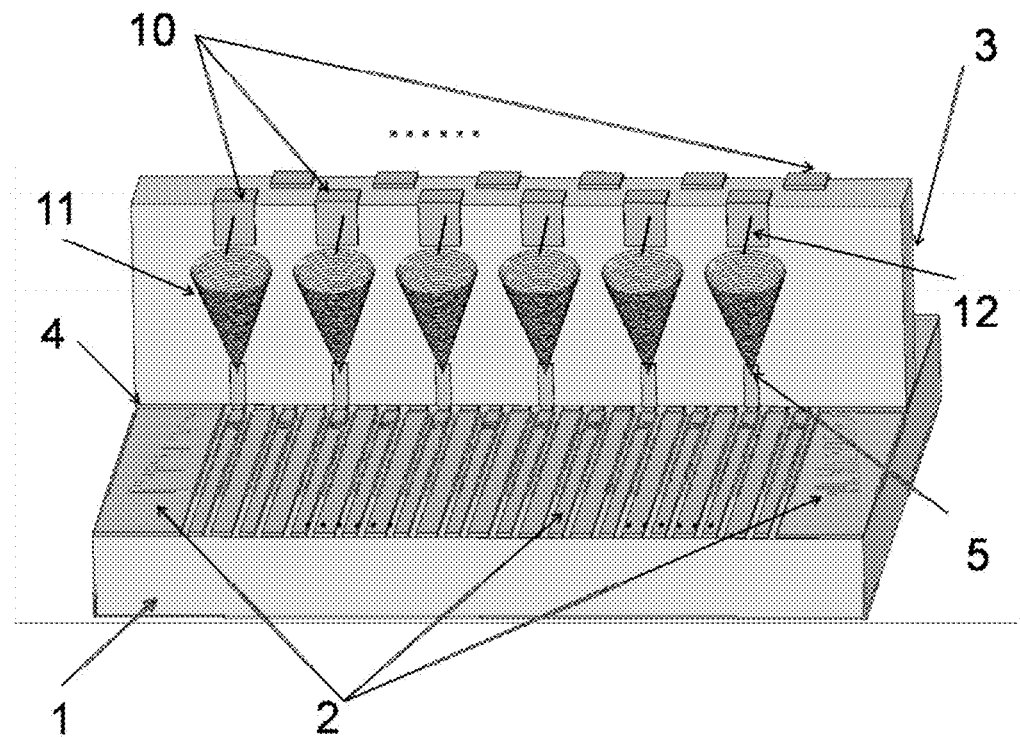
Figures 2, 5:
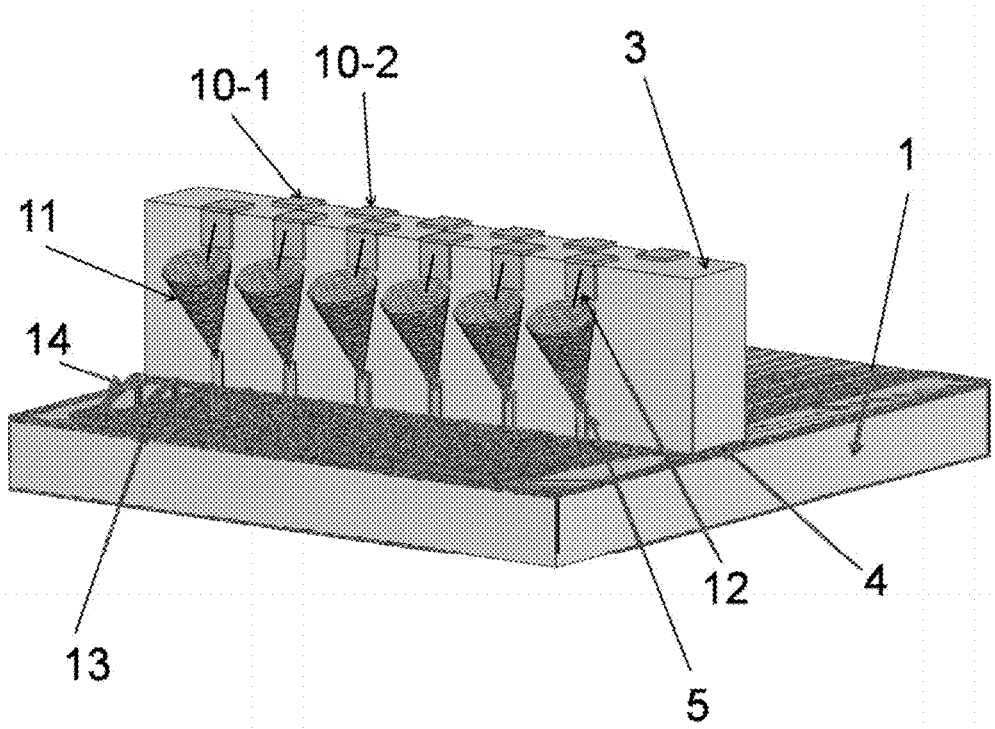
Figure 6:
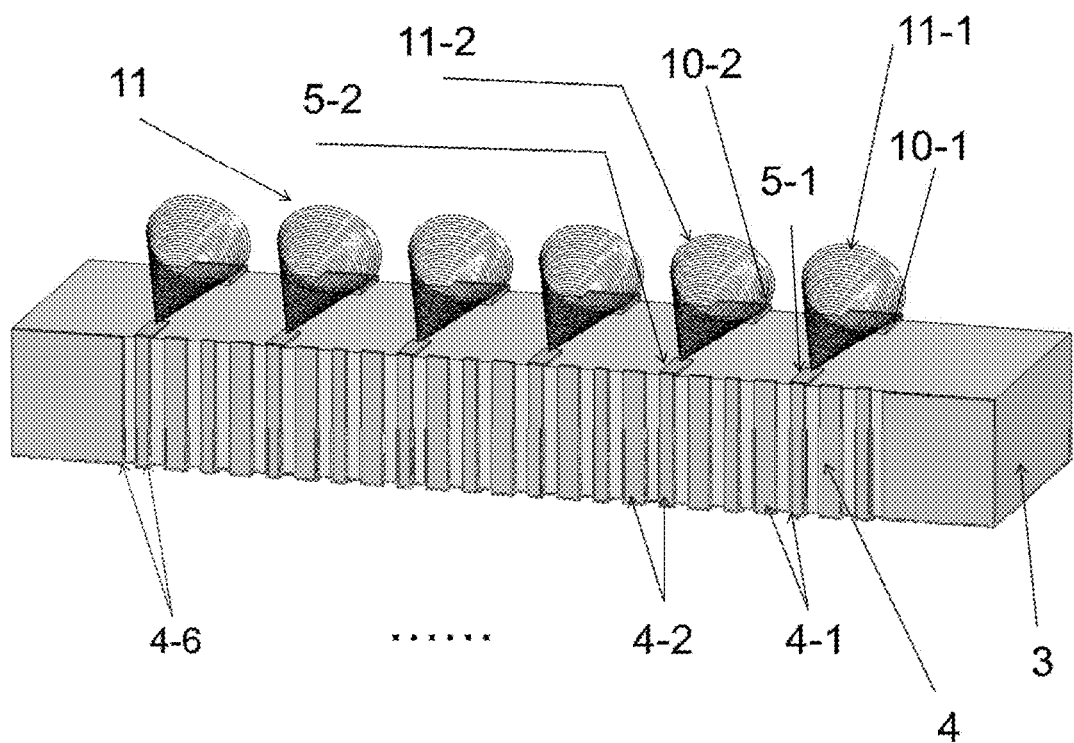
FIG. 6 is a schematic view of a second carrier substrate 3 and a microwave circuit formed by evaporation on a surface of the second carrier substrate 3 for the bias circuit and the impedance matching circuit of the direct modulation laser array package.
Figure 7:
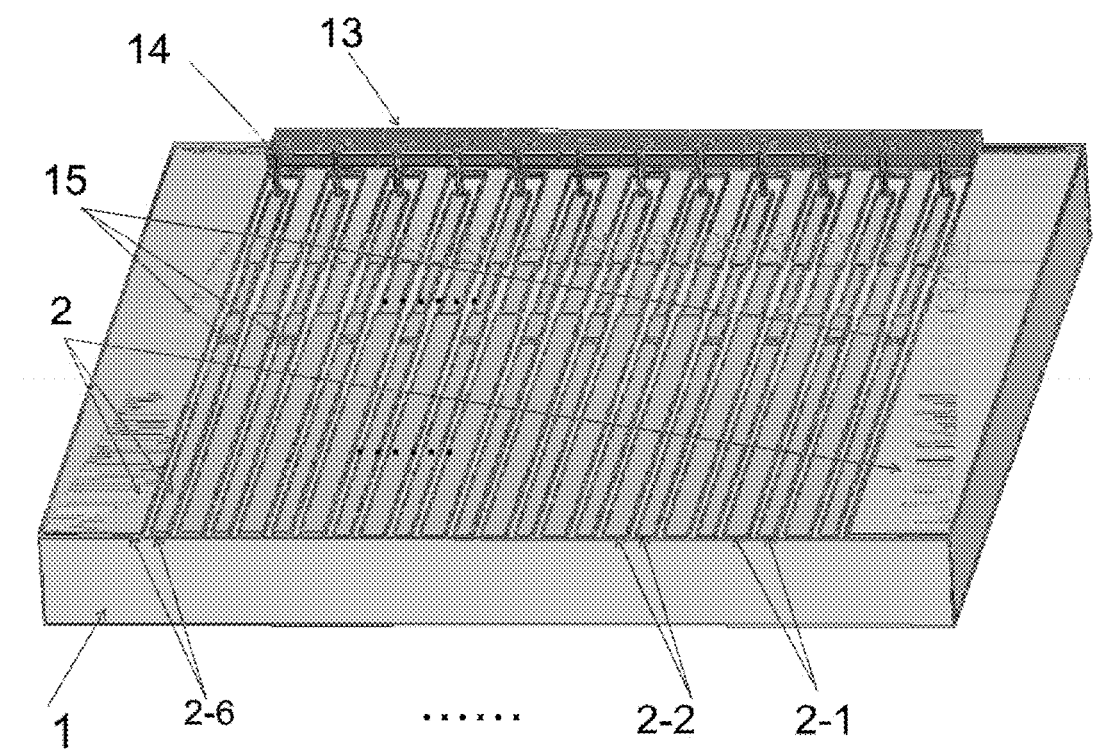
FIG. 7 is a schematic view of a first carrier substrate 1 and a microwave circuit formed by evaporation on a surface of the first carrier substrate 1 for the bias circuit and the impedance matching circuit of the direct modulation laser array package.

FIGS. 5~7 schematically show a second embodiment of a 3D package device of a photonic integrated chip matching circuit provided by the present disclosure, which comprises a DC bias circuit and an impedance matching circuit of a direct modulation laser array package.

The 3D package device comprises:
a first carrier substrate 1, which may be made of any one of aluminium nitride, beryllium nitride, aluminium oxide, diamond, beryllium oxide, and silicon carbide;

a first microwave transmission line array 2 formed by evaporation on the top surface of the first carrier substrate 1 to provide bias voltages and high-frequency modulation signals to the photonic integrated chip. Each transmission line units in the first microwave transmission line array 2 may be a co-plane waveguide or a micro-strip transmission lines. In this embodiment, the first microwave transmission line array 2 may provide DC bias voltages and high-frequency modulation signals to the direct modulation laser array in the photonic integrated chip. As shown in FIG. 7, the first microwave transmission line array 2 may have a co-plane waveguide structure comprising 12 transition line units;

a second carrier substrate 3, which may be made of any one of aluminium nitride, beryllium nitride, aluminium oxide, diamond, beryllium oxide, and silicon carbide;

a second microwave transmission line array 4 formed by evaporation on the bottom surface of the second carrier substrate 3 to match electrodes of the first microwave transmission line array 2. Each transmission line unit in the second microwave transmission line array 4 may be a co-plane waveguide or a micro-strip transmission line. The second microwave transmission line array 4 is soldered or sintered with the electrodes of the first microwave transmission line array 2, so that each signal electrode unit in the first microwave transmission line array 2 has good contact with a corresponding signal electrode unit in the second microwave transmission line array 4 and a corresponding ground electrode, as shown in FIGS. 6 and 7 by 2-1, 4-1, 2-2, and 4-2;

an electrode array 5 formed by evaporation on a side surface or two opposite side surfaces of the second carrier substrate 3. The electrode array 5 is connected with signal electrode array of the second microwave transmission line array 4, and a border of the electrode array 5 has a dimension that matches that of a border of the signal electrode array of the second microwave transmission line array 4, as shown in FIG. 6 by 5-1, 4-1, 5-2, and 4-2. In this embodiment, the electrode array 5 is formed by evaporation on two side surfaces of the second carrier substrate 3 and comprises 12 signal electrode units;

an L-shaped electrode array 10 formed by evaporation on two side surfaces and the top surface of the second carrier substrate 3, as shown in FIG. 6 by 5-1, 10-1, 5-2, and 10-2. The L-shaped electrode array 10 comprises 12 electrode units corresponding to the signal electrode units in the electrode array 5, respectively;

an inductor array 11 mounted on two side surfaces of the second carrier substrate 3. The inductor array 11 comprises 12 inductor units, each corresponding to a respective signal electrode unit in the electrode array 5. As shown in FIG. 6 by 5-1, 11-1, 5-2, and 11-2, one end of the inductor array 11 is connected with the signal electrode array 5 and the other end of the inductor array 11 is connected with the L-shaped electrode array 10 via an interconnection gold wire group 12 to form a portion of the DC bias network of the photonics integrated chip;

a direct modulation laser chip array 13. In this embodiment, the direct modulation laser chip array 13 comprises 12 lasers, each being connected with a respective transmission line unit in the first microwave transmission line array 2 via an interconnection gold wire group 14. The direct modulation laser chip array 13, the first microwave transmission line array 2, the second microwave transmission line array 4, the electrode array 5, the inductor array 11, the L-shaped electrode array 10, the interconnection gold wire group 12, and the interconnection gold wire group 14 form the DC bias network of the photonic integrated chip; and a thin-film resistor array 15. The thin-film resistor array 15 is formed by evaporation on the top surface of the first carrier substrate 1 and comprises tantalum nitride or nichrome. The thin-film resistor array 15 is connected with the first microwave transmission line array 2 to realize good contact. The resistance value of each resistor unit in the thin-film resistor array 15 is determined by the characteristic resistance value of the co-plane waveguide structure or micro-strip structure of the first microwave transmission line array 2 and the AC resistance value of the direct modulation laser chip array 13. The thin-film resistor array 15, the first microwave transmission line array 2, the direct modulation laser chip array 13, and the interconnection gold wire group 14 form an AC path in the photonic integrated chip.

The objects, technical solutions and beneficial effects of the present disclosure have been further explained in detail in connection with the above specific embodiments. It should be understood that all of the above are only specific embodiments of the present disclosure but do not constitute a restriction to the present disclosure. Any modification, equivalent substitution, and improvement, etc., within the spirit and principle of the present disclosure should be included in the scope of the present disclosure.

What is claimed is:

1. A 3D package device of a photonic integrated chip matching circuit, characterized in that it comprises:
    a first carrier substrate;
    a first microwave transmission line array formed by evaporation on a top surface of the first carrier substrate to provide bias voltages and high-frequency modulation signals to a photonic integrated chip;
    a second carrier substrate formed to be perpendicular to a main surface of the first carrier substrate or to have a certain angle with respect to the main surface of the first carrier substrate, so as to constitute a 3D impedance-matching structure;
    a second microwave transmission line array formed by evaporation on a bottom surface of the second carrier substrate to match an impedance of electrodes of the first microwave transmission line array, the second microwave transmission line array being soldered or sintered with the electrodes of the first microwave transmission line array;
    an electrode array formed by evaporation on a side surface or two opposite side surfaces of the second carrier substrate; and
    a microwave circuit.

2. The 3D package device of the photonic integrated chip matching circuit according to claim 1, characterized in that the first carrier substrate and the second carrier substrate is made of any one of aluminium nitride, beryllium nitride, aluminium oxide, diamond, beryllium oxide, and silicon carbide.

3. The 3D package device of the photonic integrated chip matching circuit according to claim 1, characterized in that transmission line units in the first microwave transmission line array and the second microwave transmission line array are co-plane waveguides or micro-strip transmission lines.

4. The 3D package device of the photonic integrated chip matching circuit according to claim 1, characterized in that the electrode array is connected with a signal electrode array of the second microwave transmission line array, and a border of the electrode array has a dimension that matches that of a border of the signal electrode array of the second microwave transmission line array.

5. The 3D package device of the photonic integrated chip matching circuit according to claim 1, characterized in that the microwave circuit is any one of an impedance matching circuit, a DC bias circuit, and any other microwave package circuit.

* * * * *